(12) United States Patent
Mahowald (10) Patent No.: US 8,400,626 B2
(45) Date of Patent: Mar. 19, 2013

(54) AMBIENT LIGHT SENSOR

(75) Inventor: Peter H. Mahowald, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 342 days.

(21) Appl. No.: 12/813,287

(22) Filed: Jun. 10, 2010

(65) Prior Publication Data

US 2011/0304847 A1  Dec. 15, 2011

(51) Int. Cl.
*G01J 1/42* (2006.01)
(52) U.S. Cl. ............................................. 356/218
(58) Field of Classification Search ............ None
See application file for complete search history.

(56) References Cited

U.S. PATENT DOCUMENTS

| | | | |
|---|---|---|---|
| 4,714,823 A | 12/1987 | Spruck et al. | |
| 4,769,753 A | 9/1988 | Knudson et al. | |
| 5,223,814 A | 6/1993 | Suman | |
| 5,497,181 A | 3/1996 | Paoli | |
| 6,095,661 A | 8/2000 | Lebens et al. | |
| 6,147,664 A | 11/2000 | Hansen | |
| 6,166,771 A * | 12/2000 | Yoshida et al. | 348/356 |
| 6,271,825 B1 | 8/2001 | Greene et al. | |
| 6,305,818 B1 | 10/2001 | Lebens et al. | |
| 6,674,561 B2 | 1/2004 | Ohnishi et al. | |
| 6,720,743 B2 | 4/2004 | Yano et al. | |
| 6,794,996 B2 | 9/2004 | Tsutsui et al. | |
| 6,841,947 B2 | 1/2005 | Berg-johansen | |
| 6,857,748 B2 | 2/2005 | Roddy et al. | |
| 6,897,884 B2 | 5/2005 | Tsuge et al. | |
| 7,008,090 B2 | 3/2006 | Blank | |
| 7,030,956 B2 | 4/2006 | Nishi et al. | |
| 7,109,465 B2 | 9/2006 | Kok et al. | |
| 7,186,000 B2 | 3/2007 | Lebens et al. | |
| 7,236,154 B1 | 6/2007 | Kerr et al. | |
| 7,256,552 B2 | 8/2007 | Ishii et al. | |
| 7,425,801 B2 | 9/2008 | Ozaki | |
| 7,446,303 B2 | 11/2008 | Maniam et al. | |
| 7,468,722 B2 | 12/2008 | Ferguson | |
| 7,477,228 B2 | 1/2009 | Wyatt | |
| 7,501,960 B2 | 3/2009 | Price et al. | |
| 7,573,472 B2 | 8/2009 | Aoki et al. | |
| 7,675,249 B2 | 3/2010 | Furukawa et al. | |
| 7,750,282 B2 | 7/2010 | Mahowald et al. | |
| 7,769,353 B2 | 8/2010 | Dietrich et al. | |
| 7,835,164 B2 | 11/2010 | Lyle | |
| 7,880,734 B2 * | 2/2011 | Khanchin | 345/204 |
| 7,903,062 B2 | 3/2011 | Miyachi et al. | |

(Continued)

FOREIGN PATENT DOCUMENTS

| | | |
|---|---|---|
| CN | 201185147 | 1/2009 |
| JP | 04212289 | 8/1992 |

(Continued)

*Primary Examiner* — Tu Nguyen
(74) *Attorney, Agent, or Firm* — David C. Kellogg (57) ABSTRACT

Embodiments described herein relate to a light sensing system. In one embodiment, the light sensing system may include a microprocessor including an input pin configured to receive a first voltage from a light sensor. The light sensing system may also include a pull-up resistor coupled to the input pin. The pull-up resistor may include a first gate. The light sensing system may further include a pull-down resistor coupled to the input pin. The pull-down resistor may include a second gate. The first and second gates may allow for connecting or disconnecting the pull-up and pull-down resistors based on the amount or intensity of light detected by the light sensor.

20 Claims, 6 Drawing Sheets

U.S. PATENT DOCUMENTS

| | | |
|---|---|---|
| 7,999,852 B2 | 8/2011 | Deroo et al. |
| 2004/0017158 A1 | 1/2004 | Ang et al. |
| 2006/0001641 A1 | 1/2006 | Degwekar et al. |
| 2006/0207134 A1* | 9/2006 | Harry .............. 40/453 |
| 2006/0232216 A1 | 10/2006 | Kosaka |
| 2007/0018919 A1 | 1/2007 | Zavracky et al. |
| 2007/0194718 A1 | 8/2007 | Foo |
| 2008/0078921 A1 | 4/2008 | Yang et al. |
| 2008/0111500 A1 | 5/2008 | Hoover et al. |
| 2010/0253228 A1 | 10/2010 | Hoover |
| 2010/0253239 A1 | 10/2010 | Hoover |

FOREIGN PATENT DOCUMENTS

| | | |
|---|---|---|
| JP | 04324294 | 11/1992 |
| JP | 05238309 | 9/1993 |
| JP | 06251889 | 9/1994 |
| JP | 06318050 | 11/1994 |
| JP | 07014694 | 1/1995 |
| JP | 10073865 | 3/1998 |
| JP | 2000098942 | 4/2000 |
| JP | 2005032470 | 2/2005 |
| JP | 2005293853 | 10/2005 |
| JP | 2006041043 | 2/2006 |
| KR | 100870113 | 11/2008 |
| WO | WO2007/102633 | 9/2007 |

* cited by examiner

AMBIENT LIGHT SENSOR

BACKGROUND

I. Technical Field

Embodiments disclosed herein relate generally to sensor devices, and, more particularly, to an ambient light sensor.

II. Background Discussion

Many electronic devices such as desktop computers, notebook computers, personal digital assistants, cell phones, and so on, include integrated light sensors configured to sense ambient light. Typically, such light sensors convert the received light into either current or voltage that may be processed by the electronic device to determine the amount of light surrounding the device. The electronic device may then control the operation of one or more components based on the sensed amount of light. As an example, laptops often include a controller that dims or brightens the laptop display screen according to a detected brightness, as measured by a light sensor.

Existing ambient light sensor devices may be complicated analog or digital circuits that require significant hardware for their implementation. For example, an analog light sensor circuit may include a silicon detector that is amplified by a circuit and converted by an analog-to-digital converter to a digital value. Digital light sensor circuits typically include a voltage-to-frequency (V/F) converter, a counter, and additional digital logic for converting the output of the light sensor for processing by the electronic device. These sensors are often complex and may be expensive to manufacture, as well as require significant power for their operation.

What is needed is a way to sense light, by an electronic device that utilizes cost-efficient hardware and software, while conserving power.

SUMMARY

Generally, embodiments described herein may relate to light sensors and light sensing systems that may be, but are not necessarily, employed in an electronic device. The embodiments may include a pull-up resistor and a pull-down resistor coupled to a digital input-output (I/O) pin of a microprocessor. In one embodiment, the pull-up and pull-down resistors may be configured to receive a voltage from a light sensor and either pull up or pull down the voltage to obtain a logic value. Additionally, some embodiments include control logic configured to connect or disconnect the pull-up and pull-down resistors based on a logic value.

One embodiment may take the form of a light sensing system. The light sensing system may include a microprocessor including an input pin configured to receive a first voltage from a light sensor. The light sensing system may also include a pull-up resistor coupled to the input pin. The pull-up resistor may include a first gate. The light sensing system may further include a pull-down resistor coupled to the input pin. The pull-down resistor may include a second gate.

Another embodiment may take the form a method for detecting levels of light. The method may include receiving a first voltage from a light sensor, connecting a pull-down resistor to obtain a first logic value, sampling a digital signal at an I/O pin, and determining a first light level based on the first logic value. Yet another embodiment may take the form of an electronic device including a light sensor configured to sense light and convert the sensed light to a first voltage and a microprocessor coupled to the light sensor. The microprocessor may include a digital I/O pin and may be configured to receive the first voltage from the light sensor. The electronic device may further include a pull-up resistor coupled to the digital I/O pin, as well as a pull-down resistor coupled to the digital I/O pin. The microprocessor may be operative to selectively connect the pull-up resistor to the digital I/O pin at least partially in response to the first voltage. The microprocessor may be further operative to selectively connect the pull-down resistor to the digital I/O pin at least partially in response to the first voltage.

DETAILED DESCRIPTION

Generally, embodiments described herein may relate to light sensors and light sensing systems that may be, but are not necessarily, employed in an electronic device. The embodiments may include a pull-up resistor and a pull-down resistor coupled to a digital input-output (I/O) pin of a microprocessor. In one embodiment, the pull-up and pull-down resistors may be configured to receive a voltage from a light sensor and either pull up or pull down the voltage to obtain a logic value. Additionally, some embodiments include control logic configured to connect or disconnect the pull-up and pull-down resistors from the microprocessor based on a determined logical value. In one embodiment, the light sensor may be configured to distinguish between three different levels of light.

Figure 1:
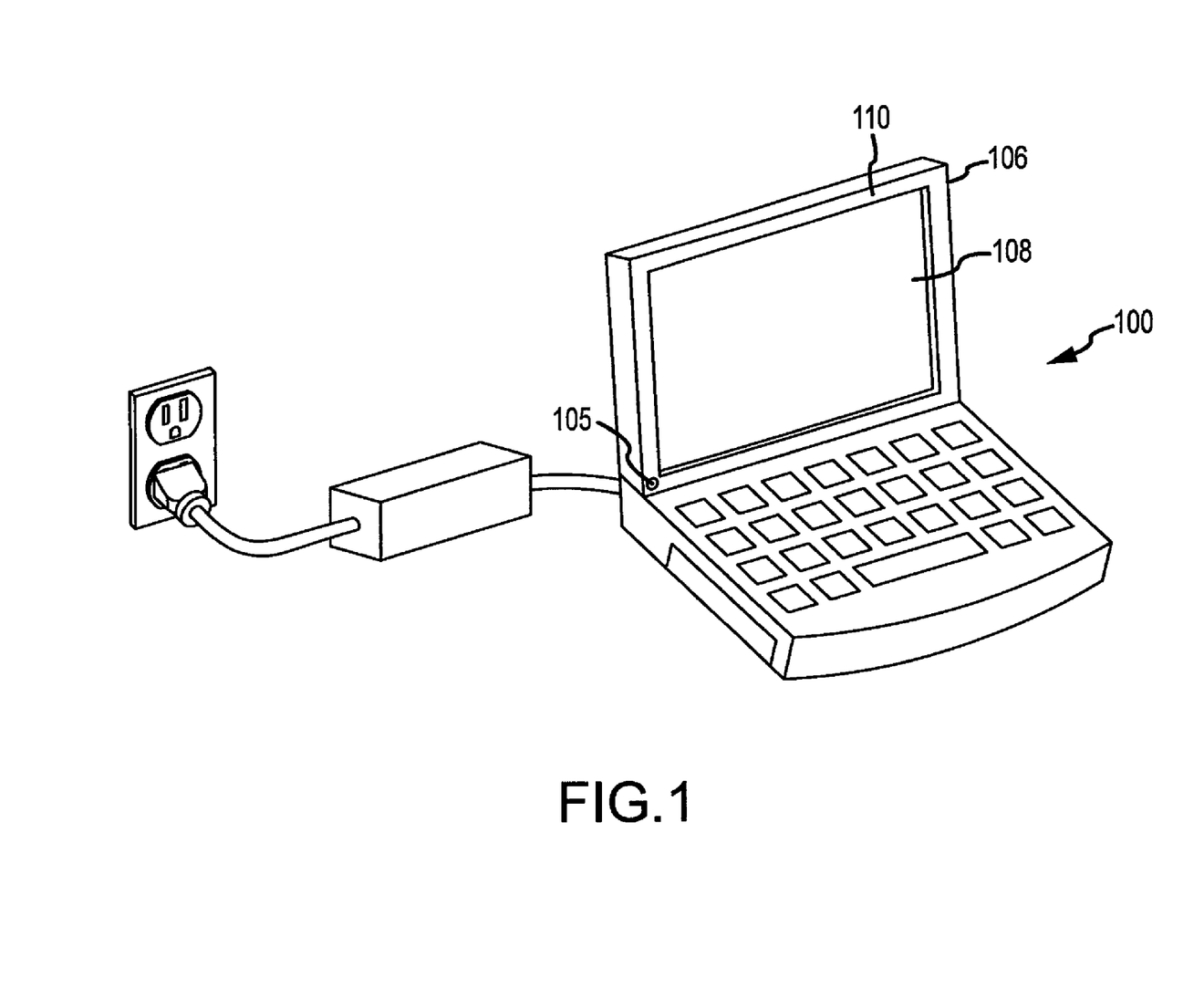
FIG. 1 illustrates an embodiment of a laptop computer that includes one embodiment of a light sensing system.

FIG. 1 is a perspective view of a laptop 100 including an ambient light sensor 102. As shown, the laptop 100 may include a base portion 104 and a cover portion 106 that may be folded over the base portion 104 for portability and/or storage. The base portion may include a housing for encasing the electronic components of the laptop 100. The electronic components may include, but are not limited to, a motherboard, central processing unit (CPU), memory, battery, controllers, and so on. The cover portion 106 may include a display device 108 and a housing configured to support the display device. In one embodiment, the housing may include a display bezel 110 configured to frame the display device 108.

The laptop 100 may further include a light sensor 105 including a light sensitive portion for sensing light impinging on the light sensor 105. In one embodiment, the light sensor 105 may be an ambient light sensor configured to sense light within the visible light spectrum. However, other embodiments may utilize other types of sensors. For example, one embodiment may include a thermal or heat sensor, an acoustic, sound, or vibration sensor, a chemical sensor, and so on and so forth. Additionally, some embodiments may utilize sensors configured to detect waves outside of the visible light spectrum. For example, the sensor may be configured to detect sound waves and/or other frequencies of electromagnetic radiation, including microwave waves, x-rays, ultraviolet radiation, infrared radiation, gamma rays, and so on.

In one embodiment, the light sensor may be mounted behind the display bezel 110 of the laptop 100. In other embodiments, the ambient light sensor may be mounted to other portions of the laptop, including, but not limited to, inside the base portion, on the exterior of the laptop, and so on. Additionally, in some embodiments, the sensor 105 may be strategically positioned in a location that enhances the accuracy of the light sensor reading and/or increases or decreases the amount of light supplied to the light sensor. The light sensor may be any type of light sensor, including, but not limited to, a photoresistor, optical detector, chemical detector, photovoltaic cell, photodiode, phototransistor, charge-coupled device, and so on.

In one embodiment, light may be supplied to the light sensitive portion of the light sensor 105 through a mechanical configuration of the laptop. For example, in some embodiments, the light sensitive portion may be fully or partially exposed or packaged within a translucent or semi-translucent window. Other embodiments may utilize different configurations for providing the light sensor with light. For example, in one embodiment, light may be supplied through an optical fiber connection. In yet another embodiment, a light sensor may be placed below a speaker grille and receive light through the grille.

As will further be described below, the light sensor may be communicatively connected to a controller that is configured to interface with an electronic component. The term "connected" or "coupled," as used herein, is intended to cover both direct and indirect connections/couplings. The controller may be any suitable control device including, but not limited to, a graphics controller, a memory controller, a network controller, a disk controller, a pulse width modulator, and so on. In some embodiments, the controller may be communicatively connected to multiple electronic components and/or the light sensor may be communicatively connected to multiple controllers.

Sample electronic components may be part of the laptop or may be a peripheral device. For example, an electronic component may be the display device on the laptop, a power supply, a light source provided within the laptop, the laptop microprocessor, a power source, an external input or output device connected to the laptop, and so on and so forth.

In one embodiment, the controller may be configured to interface with the electronic component based on an output of the light sensor. As an example, the controller may be configured to change the luminous output of a light source based on a reading of the light sensor. As another example, the controller may be configured to change the amount of power that the electronic component draws from a power source based on the light level reading of the light sensor. As a further example, the controller may be configured to change the light output of the laptop display device based on the light level reading of the light sensor. Other embodiments may include controllers that interface with a connected control component in other ways, as will be further described below.

Although the light sensor 105 is illustrated in FIG. 1 in conjunction with a laptop 100, those of ordinary skill in the art will recognize that the light sensor 105 may be implemented in a variety of electronic devices including, but not limited to, portable computing devices, cell phones, televisions, personal computers, smart phones, personal digital assistants, media players, appliances such as refrigerators, microwave ovens, and any other suitable electronic device. As such, although the description included herein may include some specific embodiments, it should be understood that the light sensor may be implemented in a wide variety of devices and may perform a variety of functions beyond the embodiments specifically described herein.

Figure 2:
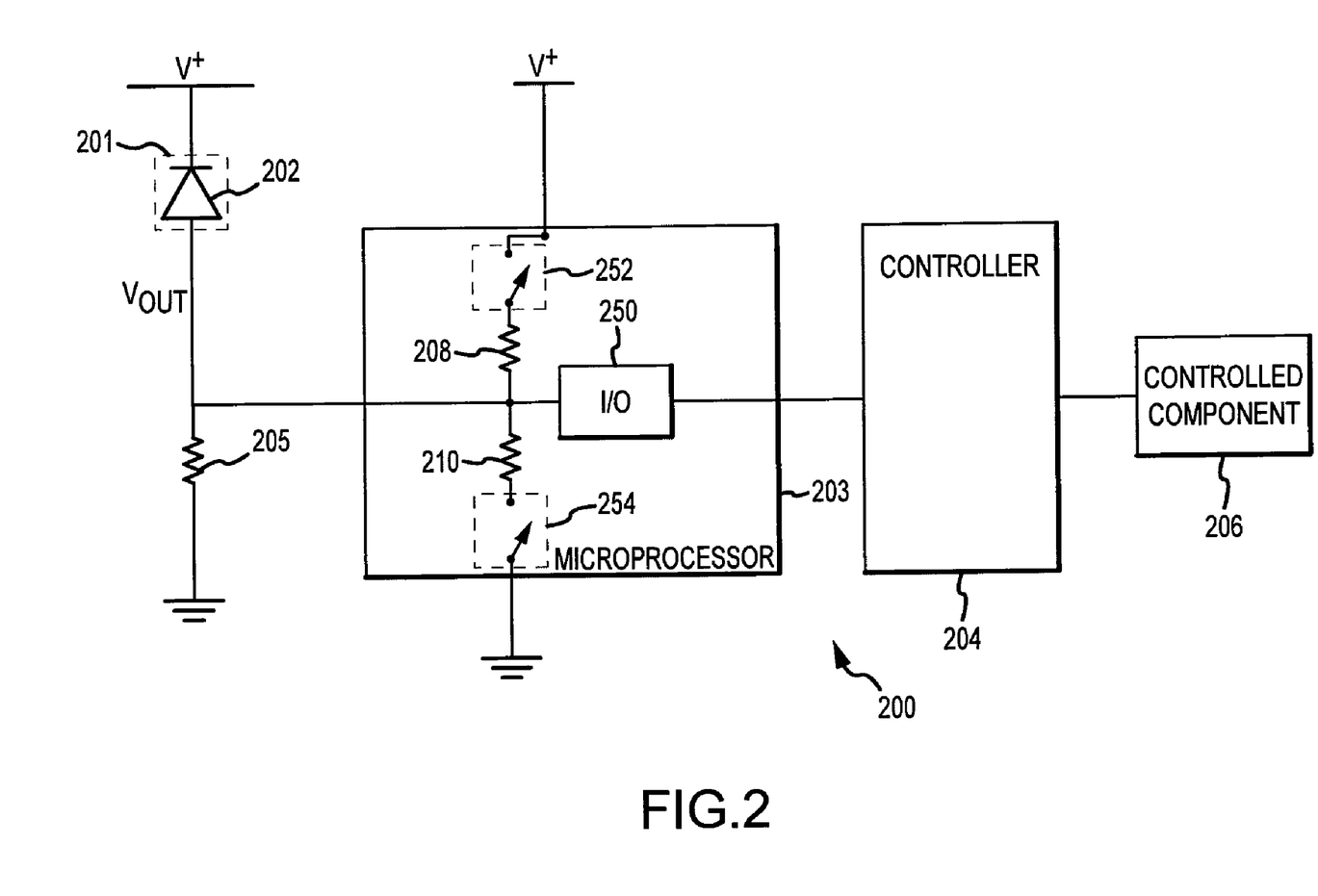
FIG. 2 is a schematic diagram of the embodiment of the light sensing system of FIG. 1.

FIG. 2 illustrates a simplified schematic diagram of one embodiment of an ambient light sensing system 200 that may be used in conjunction with the laptop of FIG. 1 or another electronic device. As shown, the light sensing system 200 may include a light sensor 201 connected to a microprocessor 203. In one embodiment, the microprocessor may include a digital I/O pin 250, a pull-up resistor 208, and a pull-down resistor 210. The input of the I/O pin 250 may be connected to the output of the light sensor 201 and the output of the I/O pin may be connected to a controller 204. The light sensing system 200 may further include a controlled component 206 connected to the controller 204. In some embodiments, the controller may be omitted and the microprocessor may directly control the component 206.

In one embodiment, the light sensor 201 may include a photodiode 202. As discussed above, the photodiode may include a light sensitive portion configured to sense or detect light impinging on the light sensor. In other embodiments, the light sensor 201 may include another type of semiconductor diode, or other electrical device, configured to convert light to a measurable current or voltage. For example, in certain embodiments the light sensing system 200 may utilize some other types of light sensors, such as a phototransistor, photoresistor, photovoltaic cell, and so on. Some embodiments utilizing a light sensor 201 configured to convert light to current may further include a current-to-voltage converter (or transimpedance amplifier) for converting the current received from the light sensor to a corresponding voltage. Additionally and as discussed above, other embodiments may utilize other types of sensors in order to measure other variables, such as a thermal resistor having a resistance that varies with a sensed temperature.

The photodiode 202 may be coupled to a voltage source. For example, the voltage source may be a power supply, battery, and so on and so forth. The photodiode 202 may be configured to convert light to a measurable current or voltage, with the amount and/or intensity of light impinging on the photodiode determining the amount of current or level of voltage output by the photodiode. In one embodiment, the photodiode may have a PN structure. However, in other embodiments, the photodiode may have a PIN structure. Other embodiments may have other diode configurations. The photodiode 202 may be connected to the I/O pin 250 of the microprocessor 203. In some embodiments, the photodiode may also be controlled by control logic configured to activate and deactivate a pull-up resistor 208 and a pull-down resistor 210. The control logic may be provided by the microprocessor 203. In other embodiments, the pull-up resistor 208 and pull-down resistor 210 may be activated and deactivated via a floating gate analog circuit or application-specific integrated digital circuit. However, in other embodiments, the control logic may be provided by a source outside the microprocessor 203. In one embodiment, the control logic may be software. In further embodiments, the control logic may be a circuit configured to execute the logic functions discussed herein, an additional microprocessor, firmware, or any other software or hardware configured to perform the logic functions discussed herein.

In some embodiments, the photodiode 202 and the I/O pin 250 may further be connected to an optional resistor 205 for correcting dark current leakage of the photodiode 202. As is shown, the resistor 205 may be connected to ground. In one embodiment, the resistor 205 may have a resistance that compensates for any dark current leakage of the photodiode 202.

However, in other embodiments, the resistor 205 may be temperature compensated, such as a thermistor having a resistance that varies with temperature, to more closely track the dark current of the photodiode 202 as it varies with temperature. This may serve to improve over-temperature performance of the light sensing system 200, for example, when the dark current leaked from the photodiode 202 is significant as compared to current in the pull-down resistor 210. The resistance of the resistor 205 may be higher or lower according to different embodiments, or may be omitted from the light sensing system 200 altogether.

Generally, the photodiode 202 may convert light impacting the photodiode to voltage or current having a first voltage level $V_{out}$. In one embodiment, the photodiode 202 may be configured to transmit the first voltage $V_{out}$ to the control logic, which may be configured to connect and disconnect the pull-up and pull-down resistors 208, 210 of the microprocessor 203. As shown, the pull-up resistor 208 may include a logic gate 252 for connecting or disconnecting the resistor 208 to the voltage source. When the logic gate 252 is closed and the logic gate 254 is open, the pull-up resistor 208 may pull the first voltage $V_{out}$ towards a high voltage level, which may be the voltage source level, $V^+$. Similarly, the pull-down resistor 210 may include a logic gate 254 for connecting or disconnecting the resistor 210 to ground. When the gate 254 is closed and the gate 252 is open, the pull-down resistor 210 may pull the first voltage $V_{out}$ toward a low voltage level, or ground. As will be further discussed below, the high and low voltage levels may correspond to logic values representing different levels of light, as detected by the photodiode. For example, in one embodiment, the high voltage level may correspond to a logical output of "1" and the low voltage level may correspond to a logical output of "0." In certain embodiments, the logic gates and/or pull-up and pull-down resistors may be external to the microprocessor 203.

In one embodiment, the logic gates 252, 254 each take the form of, or include, a switch that may be opened or closed based on the control logic. In other embodiments, the logic gate functions may be performed by one or more transistors. For example, each logic gate 252, 254 may include a p-type or n-type metal oxide semiconductor field effect transistor (MOSFET) configured to act as a logic gate. In another embodiment, the logic gate 252, 254 may take the form of a circuit, such as a CMOS or an NMOS circuit.

The logic values supplied by the pull-up and pull-down resistors 208, 210 may be transmitted to the input of the microprocessor I/O pin 250. In one embodiment, the I/O pin 250 may be connected at a junction between the pull-up and pull-down resistors 208, 210. However, in other embodiments, the I/O pin 250 may be otherwise connected to the resistors 208, 210. For example, the I/O pin 250 may include two inputs that are each connected to a pull-up or pull-down resistor 208, 210.

The output of the I/O pin 250 may be connected to a controller 204. As mentioned above, the controller 204 may be configured to process the logic value received from the I/O pin 250 to derive a control signal for controlling at least one function of a controlled component. The control signals may be transmitted to the controlled component 206 via any suitable communication medium. For example, the control signals may be transmitted through a wired connection or wirelessly, over a network, computer channel, as part of an integrated circuit or internally to the microprocessor 203, and so on.

In one embodiment, the pull-up and pull-down resistors 208, 210 may be configured to pull up and pull down, respectively, the first voltage $V_{out}$ based on a threshold voltage level.

For example, in one embodiment, the pull-up resistor 208 may be configured to pull up the first voltage $V_{out}$ if the voltage is greater or equal to the threshold voltage level. The threshold voltage may be any desired or programmed voltage level. In one particular embodiment, the threshold voltage may be equal to half of the source voltage.

The pull-down resistor 210 may operate similar to the pull-up resistor 208. In one embodiment, the pull-down resistor 210 may be configured to pull down the first voltage $V_{out}$ if the voltage is less than or equal to the threshold voltage level. In another embodiment, the pull-down resistor 210 may be configured to pull down the first voltage $V_{out}$ if the first voltage is less than the threshold voltage level. Other embodiments may include other ways of determining whether to pull up or pull down the first voltage $V_{out}$.

In some embodiments, the threshold voltage levels of the pull-up resistor 208 may be different than the threshold voltage level of the pull-down resistor 210. For example, in one embodiment, the threshold voltage level of the pull-down resistor 210 may be larger than the threshold voltage of the pull-up resistor 208. However, in other embodiments, the threshold voltage levels of the pull-up and pull-down resistors 208, 210 may be substantially equal.

The use of pull-up and pull-down resistors 208, 210 may enhance the performance of the light sensor 201, while allowing the microprocessor 203 to draw less power during operation. In some embodiments, the logic gates 252, 254 may continually draw current when the first voltage $V_{out}$ level is between the source voltage and ground due to the creation of an electrical potential difference across the resistors 208, 210. For example, if the first voltage $V_{out}$ level is between the threshold voltage level and ground and the pull-up resistor 208 is connected, the logic gate 252 corresponding to the pull-up resistor 208 may draw current due to the potential difference across the pull-up resistor. In one embodiment, this potential difference may be substantially equal to the difference in voltage between the first voltage $V_{out}$ level and the source voltage level. As another example, if the first voltage $V_{out}$ level is between the threshold voltage level and the source voltage level and the pull-down resistor 210 is connected, the logic gate 254 corresponding to the pull-down resistor 208 may draw current due to the potential difference across the pull-down resistor. In one embodiment, this potential difference may be substantially equal to the difference in voltage between the first voltage $V_{out}$ level and ground.

However, when the first voltage $V_{out}$ is pulled up or down, the logic gates 252, 254 may be prevented from drawing excessive current and wasting power supplied by the electronic device, since the potential difference across the resistors is minimized. For example, in one embodiment, if the first voltage $V_{out}$ level is between the threshold voltage level and ground, connecting the pull-down resistor 210 may pull the first voltage $V_{out}$ down to ground so that there is no potential difference across the pull-down resistor 210. Similarly, in another embodiment, if first voltage $V_{out}$ level is between the threshold voltage level and the source voltage, connecting the pull-up resistor 208 may pull the first voltage $V_{out}$ level up to the source voltage so that there is no potential difference across the pull-up resistor 208. Additionally, pulling the first voltage $V_{out}$ up or down reduces the risk of accidentally activating the gates 252, 254, which may occur if the first voltage $V_{out}$ is left near the threshold voltage level. Accordingly, the pull-up and pull-down resistors 208, 210 may provide additional power savings by preventing such accidental activation.

The use of pull-up and pull-down resistors 208, 210 further eliminates some of the complicated circuitry associated with existing light sensors, thereby allowing for better utilization of space on the microprocessor chip. Accordingly, some embodiments may employ a larger light sensitive area to increase the accuracy or sensitivity of the light readings.

Figure 3:
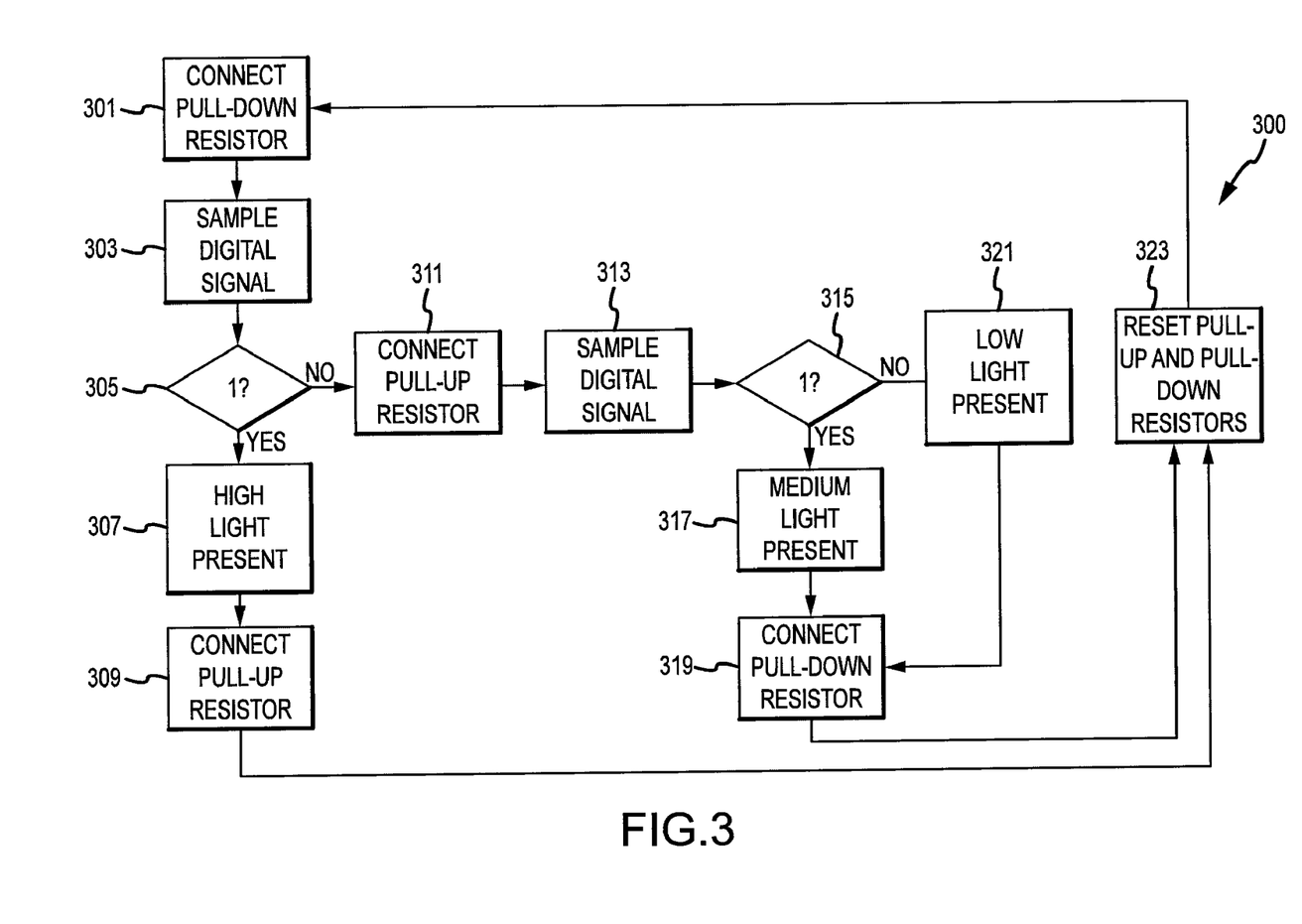
FIG. 3 is a flowchart illustrating one embodiment of a method for detecting levels of light.

FIG. 3 is a flowchart illustrating an embodiment of a method 300 for detecting levels of light using a light sensor. In one embodiment, the light sensor may be a photodiode 202 as shown in the embodiment of FIG. 2, although other embodiments may utilize other types of sensors. The method presumes that both the pull-up and pull-down resistors are initially not connected. That is, the method presumes that gates 252 and 254 are both open.

The method 300 includes connecting a pull-down resistor 210 to the digital I/O pin 250 of a microprocessor 203, as indicated at block 301. As discussed above, this may be performed by control logic configured connect the pull-down resistor 210 to the digital I/O pin 252 of the microprocessor 203. In the operation of block 303, the control logic may then sample the digital signal at the I/O pin 252 to determine its logic value. As discussed above, the logic value may correspond to the light level or intensity detected by the photodiode 202.

In one embodiment, the logic value may be obtained by comparing the voltage $V_{out}$ output by the photodiode 202 to a threshold voltage level. If the voltage $V_{out}$ is greater than or, alternatively, greater than or equal to the threshold voltage level, then the pull-down resistor may not be connected (e.g., the corresponding gate 254 may be opened). In this example, the sampled digital signal at the I/O pin may be the voltage $V_{out}$, resulting in a logical output of 1. In contrast, if the voltage $V_{out}$ output by the photodiode 202 is less than, or alternatively, less than or equal to, the threshold voltage level, connecting the pull-down resistor may pull the voltage $V_{out}$ to ground, e.g., to generate a logical output of "0."

If, in the operation of block 305, the sampled logic value is a logical output of 1, then, in the operation of block 307, the control logic may presume that the photodiode 202 is receiving a large amount of light or, alternatively, that the received light has a high intensity. In the operation of block 309, the pull-up resistor 208 may then be connected to pull the voltage $V_{out}$ to the high voltage level and prevent the logic gates 252, 254 from drawing current. The method 300 may then proceed to the operation of block 323, in which the control logic may reset the pull-up and pull-down resistors 208, 210 in preparation for a subsequent reading, in which the operations of the method are repeated. In one embodiment, this may involve disconnecting the pull-up and pull-down resistors.

If, in the operation of block 305, the logic value is a logical output of 0, then, in the operation of block 311, the control logic may be configured to connect the pull-up resistor 208 to the voltage source V+. Upon connecting the pull-up resistor 208, the pull-down resistor 210 may simultaneously be disconnected from the I/O pin.

In the operation of block 313, the control logic may be configured to sample the logic value at the I/O pin 250 a second time. As discussed above, the logic value may be obtained by comparing the voltage $V_{out}$ output by the photodiode 202 to a threshold voltage level. If the voltage $V_{out}$ is greater than, or alternatively, greater than or equal to, the threshold voltage level, then connecting the pull-up resistor may generate a logical output of 1. In contrast, if the voltage $V_{out}$ is less than, or alternatively, less than or equal to the threshold voltage level, then connecting the pull-up resistor may generate a logical output of 0.

If, in the operation of block 315, the sensed logic value at the I/O pin 250 is a logical output of 1, then in the operation of block 317, the control logic may determine that the photodiode is receiving a medium amount of light, or alternatively, that the received light has a medium intensity. In the operation of block 319, the pull-down resistor may be connected so as to pull the voltage $V_{out}$ to the low voltage level and prevent the logic gates 252, 254 from drawing current.

If, in the operation of block 315, the sensed the logic value is a logical output of 0, then, in operation 321, the control logic may determine that the photodiode is receiving a low amount of light or no light. Accordingly, the pull-down resistor 210 may be connected so as to pull the voltage $V_{out}$ to the low voltage level. The method 300 may then proceed to the operation of block 323, in which the control logic may reset the pull-up and pull-down resistors and repeat the operations of the method 300.

Table 1, shown below, summarizes the logic values and associated light levels according to the embodiment just described:

TABLE 1

| Light Level | State of pull-down resistor at block 301 | State of pull-up resistor at block 311 | Logical output at block 303 | Logical output at block 313 |
| --- | --- | --- | --- | --- |
| HIGH | Do not pull down to low voltage level | N/A | 1 | N/A |
| MEDIUM | Pull down to low voltage level | Pull up to high voltage level | 0 | 1 |
| LOW | Pull down to low voltage level | Do not pull up to high voltage level | 0 | 0 |

Figure 4:
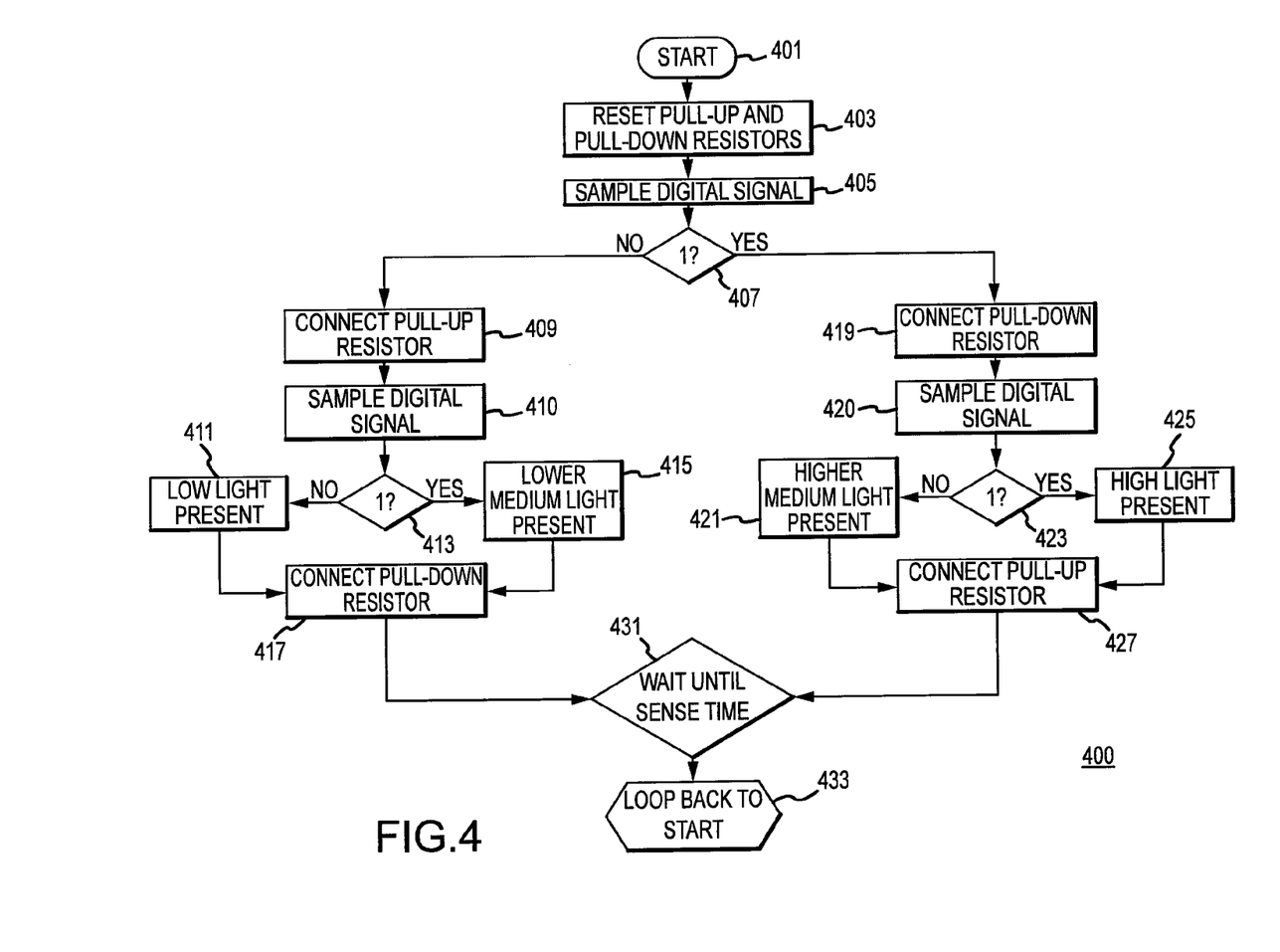
FIG. 4 is a flowchart illustrating another embodiment of a method for detecting levels of light.

FIG. 4 is a flowchart illustrating another embodiment of a method 400 for detecting levels of light using a light sensor. Similar to the embodiment shown in FIG. 3, the light sensor may be a photodiode 202 as shown in the embodiment of FIG. 2, although other embodiments may utilize other types of sensors.

The method 400 of FIG. 4 may permit distinguishing multiple intermediate levels of light that occur between the high and low levels. These intermediate levels are depicted in FIG. 4 as "higher" and "lower" medium levels. The "higher" medium level may represent a higher intensity or, alternatively, a larger amount of received light than the "lower" medium level.

The method may begin in the operation of block 401. In the operation of block 403, both the pull-up and pull-down resistors 208, 210 may be reset. In one embodiment, this may be accomplished by disconnecting the pull-up and pull-down resistors 208, 210. That is, the logic gates 252 and 254 may both be open.

In the operation of block 407, the microprocessor may sample the digital signal at the I/O pin 250. If, in the operation of block 407, the sampled logic value at the I/O pin 250 is a logical output of 1, then the control logic may presume that the photodiode 202 is receiving at least a larger medium amount of light (or that the received light has a higher medium intensity). In one embodiment, the control logic may presume that the photodiode is receiving either a large amount of light (or alternatively, that the received light has a high intensity) or a larger medium amount of light. In the operation of block 419, the pull-down resistor 210 may be connected. That is, the corresponding logic gate may be closed. In the operation of block 420, the microprocessor may take another sample of the digital signal at the I/O pin 250.

If, in the operation of block 405, the sampled logic value at the I/O pin 250 is a logical output of 1, then, in the operation of block 425, the control logic may presume that the photodiode 202 is receiving a large amount of light. In the operation of block 427, the pull-up resistor may then be connected to pull the voltage $V_{out}$ to the high voltage level and prevent the logic gates 252, 254 from drawing current. The method 400 may then proceed to the operation of block 431, in which the control logic may wait until the next subsequent reading. The operation of block 431 is optional. Accordingly, in some embodiments, the control logic may wait a predetermined period of time before obtaining another reading. However, in other embodiments, the control logic may obtain the next reading without any intervening delay period. The method 400 may then proceed to the operation of block 433, in which the operations of the method are repeated.

If, in the operation of block 423, the sampled logic value at the I/O pin 250 is a logical output of 0, then, in the operation of block 421 the control logic may presume that the photodiode 202 is receiving a higher medium level of light that may have a lower intensity or, alternatively, a smaller amount of light than the high level of light detected in block 425. In the operation of block 427, the pull-up resistor may then be connected to pull the voltage $V_{out}$ to the high voltage level to prevent the logic gates 252, 254 from drawing current due to a potential difference over the pull-down resistor 210. The method 400 may then proceed to the operation of block 431, in which the control logic may wait until the next subsequent reading subsequent reading. The operation of block 431 is optional. Accordingly, in other embodiments, the control logic may obtain the next light reading without any intervening delay period. The method 400 may then proceed to the operation of block 433, in which the operations of the method are repeated.

If, in the operation of block 407, the sampled logic value at the I/O pin 250 is a logical output of 0, then the control logic may presume that the photodiode 202 is receiving less than a lower medium amount of light (or that the received light has less than a lower medium intensity). In one embodiment, the control logic may presume that the photodiode is receiving either a low amount of light (or, alternatively, that the received light has a low intensity) or a lower medium amount of light.

In the operation of block 409, the pull-up resistor 208 may be connected. In the operation of block 410, the microprocessor may take another sample of the digital signal at the I/O pin 250. If, in the operation of block 410, the sampled logic value is a logical output of 1, then, in the operation of block 415, the control logic may presume that the photodiode 202 is receiving a lower medium amount of light. In the operation of block 417, the pull-down resistor 210 may then be connected to pull the voltage $V_{out}$ to the low voltage level and prevent the logic gates 252, 254 from drawing current due to a potential difference over the pull-up resistor 208. The method 400 may then proceed to the operation of block 431, in which the control logic may wait until the next subsequent reading. As discussed above, the operation of block 431 is optional. Accordingly, in some embodiments, the control logic may obtain the next reading without any intervening delay period. The method 400 may then proceed to the operation of block 433, in which the operations of the method are repeated.

If, in the operation of block 413, the sampled logic value at the I/O pin 250 is a logical output of 0, then, in the operation of block 411, the control logic may presume that the photodiode 202 is receiving a low level of light that may be of lower intensity or, alternatively, a lower amount of light than the lower medium level of light detected in block 415. In the operation of block 417, the pull-down resistor may then be connected to pull the voltage $V_{out}$ to the low voltage level and prevent the logic gates 252, 254 from drawing current. The method 400 may then optionally proceed to the operation of block 431, as discussed above. The method 400 may then proceed to the operation of block 433, in which the operations of the method are repeated.

Table 2, shown below, summarizes the logic values and associated light levels according to the embodiment just described.

TABLE 2

| Light Level | State of pull-down resistor at block 419 | State of pull-up resistor at block 409 | Logical output as determined at blocks 413/423 |
|---|---|---|---|
| HIGH | Do not pull down to low voltage level | N/A | 1 |
| HIGHER MEDIUM | Pull down to low voltage level | N/A | 0 |
| LOWER MEDIUM | N/A | Pull up to high voltage level | 1 |
| LOW | N/A | Do not pull up to high voltage level | 0 |

In one embodiment, the I/O pin may be sampled at uniform time intervals. However, in other embodiments, the I/O pin may be sampled at varying time intervals. The duration of the time intervals may vary according to different embodiments, and may depend on the desired response time for adjusting the controlled component. In other embodiments, a pulse width modulator may be connected to the output of the I/O pin and the light level be determined by measuring the duty cycle a pulse waveform. Another embodiment may utilize a voltage-to-frequency (V/F) converter connected to a counter. The light level may be determined by counting the pulses of the I/O pin output.

Figure 5:
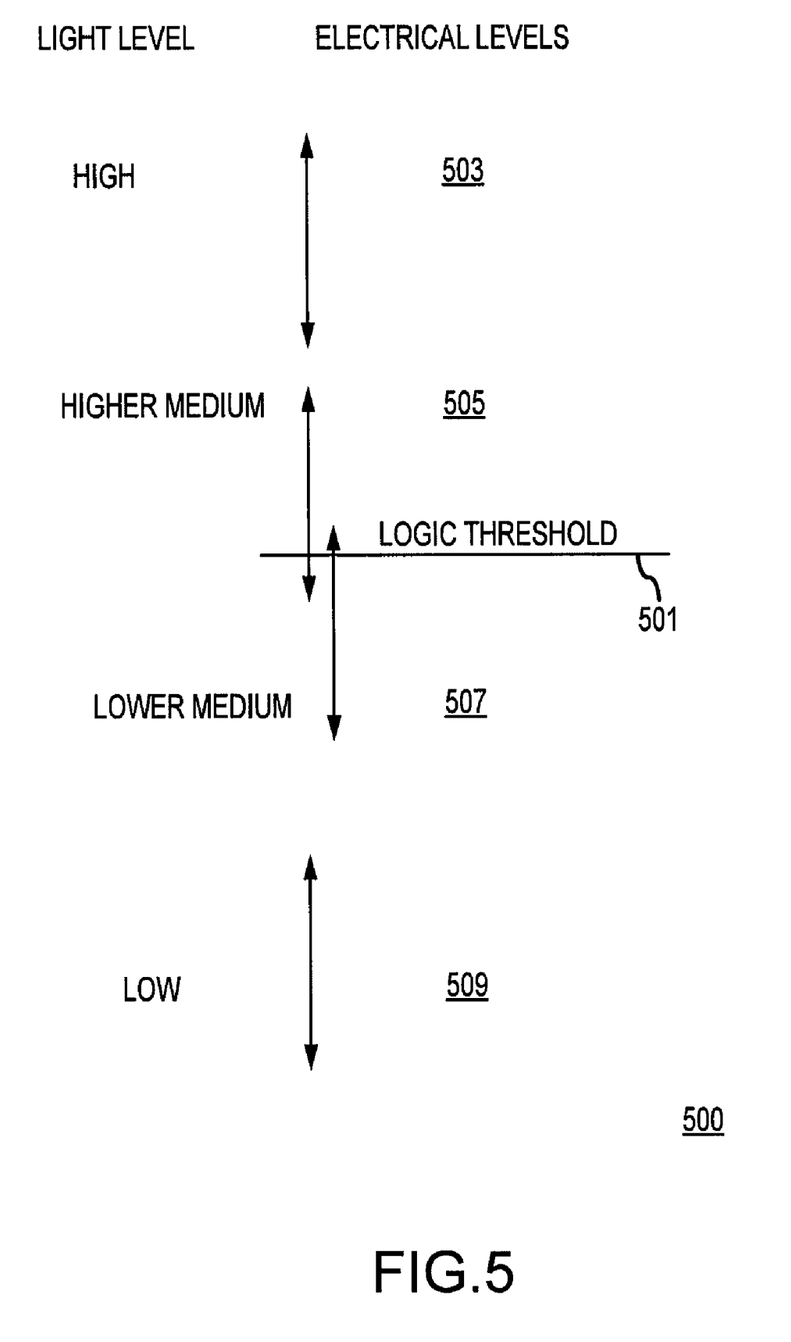
FIG. 5 is a state diagram corresponding to the method of FIG. 4.

FIG. 5 illustrates a state diagram 500 corresponding to the method 400 of claim 4. As shown in FIG. 5, the method 400 may facilitate distinguishing between high, higher medium, lower medium, and low light levels based on a logic threshold 501. In one embodiment, the threshold 501 for the pull-down resistors 210 may be set to a suitably low level such that the high levels of light 503 may not be pulled below the logic threshold using a pull-down resistor. Accordingly, the logic value at the I/O pin 250 may remain unchanged after the pull-down resistor is applied. Similarly, the threshold for the pull-up resistors 208 may be set to a suitably high level such that the low levels of light 509 may not be pulled above the logic threshold level 501 using a pull-up resistor. Accordingly, the logic value at the I/O pin 250 may remain unchanged after the pull-up resistor is applied.

In contrast, the electrical levels encompassed by the higher medium 505 and lower medium 507 levels of light may overlap the logic threshold 501. Accordingly, when the pull-up and pull-down resistors 208, 210 are connected, the logic value at the I/O pin 250 may change. As discussed above with respect to the method 400 illustrated in FIG. 4, the logic value may be sampled before and after the pull-up and pull-down resistors 208, 210 are connected to detect this change, and to distinguish the higher medium light level from the high light level and the lower medium light level from the low light level.

Table 3 illustrates another possible state diagram of the method 400 in which the sampled logic value in the operation of block 405 may be used for determining whether the pull-up or pull-down resistor should be connected in operations 409 or 419, as well as for determining whether the received light is at or above a higher medium or at or below lower medium light level:

TABLE 3

| Light Level | State of pull-down resistor at block 419 | State of pull-up resistor at block 409 | Logical output as determined at block 407 | Logical output as determined at blocks 413/423 |
|---|---|---|---|---|
| HIGH | Do not pull down to low voltage level | N/A | 1 | 1 |
| HIGHER MEDIUM | Pull down to low voltage level | N/A | 1 | 0 |
| LOWER MEDIUM | N/A | Pull up to high voltage level | 0 | 1 |
| LOW | N/A | Do not pull up to high voltage level | 0 | 0 |

Figure 6:
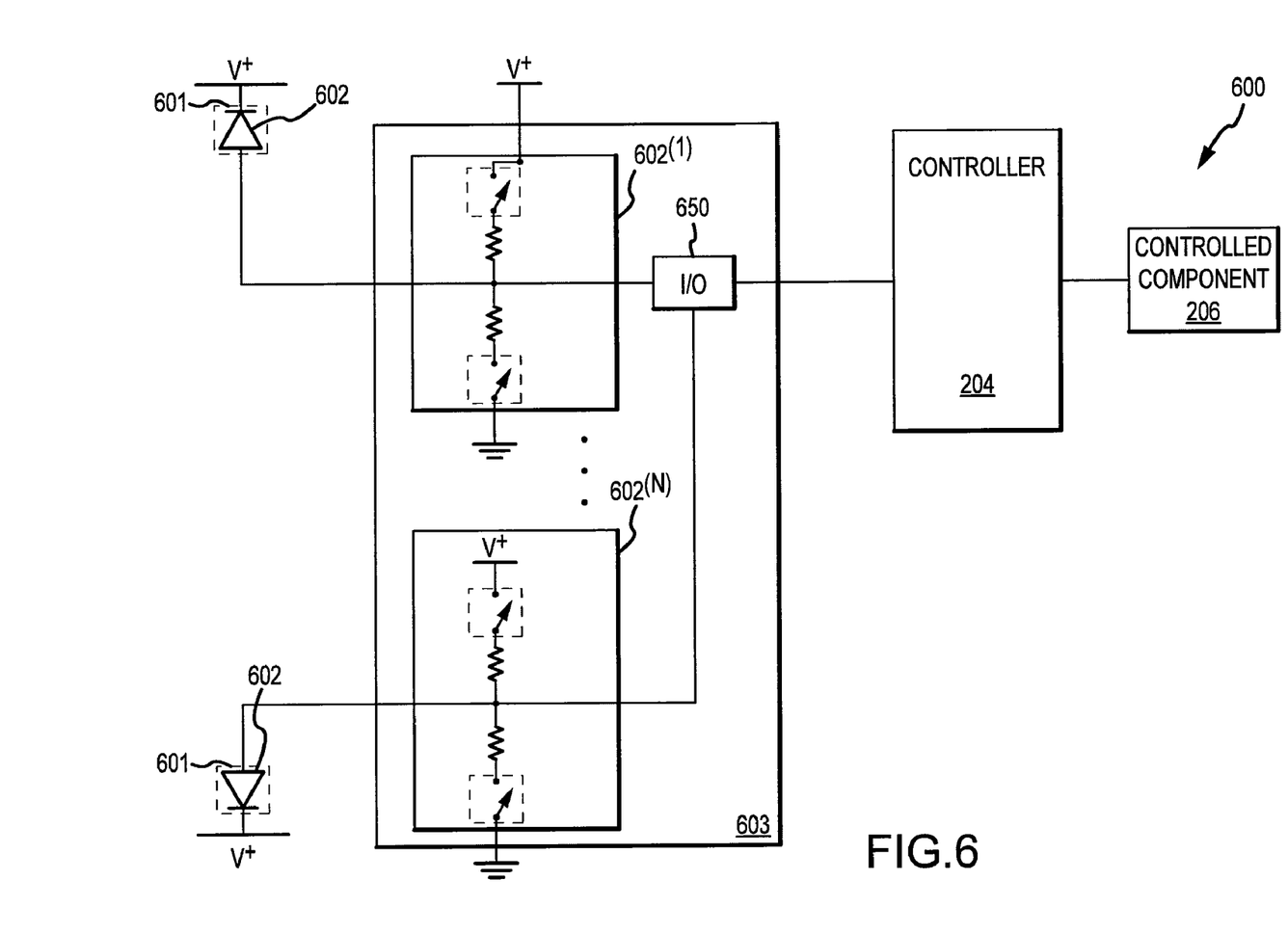
FIG. 6 is a schematic diagram of another embodiment of the light sensing system.

Another embodiment of a light sensing system 600 is illustrated in FIG. 6. As shown, some embodiments may include multiple inputs 601 and pull-up/pull-down resistor circuits 602(1)-602(n) to measure additional levels of light. In one embodiment, the number of different detectable light levels may be directly proportional to the number of pull-up/pull-down resistor circuits 602(1)-602(n) within a microprocessor 603. For example, the illustrated embodiment, which includes n pull-up/pull-down resistor circuits 602(1)-602(n), may allow for the detection of 3*n different light levels. The different light levels may all be associated with the same electronic device, or may be associated with different devices.

Other embodiments may include other circuit configurations. For example, one embodiment may include multiple pull-up/pull-down resistor circuits 602(1)-602(n) connected to a single input. Other embodiments may include multiple control logic blocks, more or fewer pull-up and/or pull-down resistors, and so on. Additionally, some embodiments may include microprocessors having multiple output pins for interfacing with multiple controllers. Accordingly, in some embodiments, a single microprocessor may produce light readings that may be processed by multiple controllers.

Although various specific embodiments have been described above, it should be appreciated that a single device may implement various different aspects of the specific embodiments described above. Further, one or more aspect may be implemented in an embodiment without including other aspects.

The invention claimed is:

1. A light sensing system, comprising:
    a microprocessor including an input pin, the input pin configured to receive a first voltage from a light sensor;
    a pull-up resistor coupled to the input pin, the pull-up resistor including a first gate; and
    a pull-down resistor coupled to the input pin, the pull-down resistor including a second gate.

2. The light sensing system of claim 1, wherein the light sensor is a photodiode.

3. The light sensing system of claim 1, wherein the light sensor is configured to sense light and convert the sensed light to the first voltage.

4. The light sensing system of claim 1, wherein the first gate is configured to connect the pull-up resistor to a source voltage.

5. The light sensing system of claim 4, wherein the first gate is configured to connect the pull-up resistor based on whether the first voltage is greater than a threshold voltage level.

6. The light sensing system of claim 1, wherein the second gate is configured to connect the pull-down resistor to ground.

7. The light sensing system of claim 6, wherein the second gate is configured to connect the pull-down resistor based on whether the first voltage is less than a threshold voltage level.

8. The light sensing system of claim 1, wherein the light sensor is connected to a source voltage.

9. The light sensing system of claim 1, wherein the input pin is connected to a controller.

10. The light sensing system of claim 1, wherein the first gate is a CMOS circuit.

11. A method for detecting levels of light, comprising:
    receiving a first voltage from a light sensor;
    connecting a pull-down resistor to obtain a first logic value;
    sampling a digital signal at an I/O pin; and
    determining a first light level based on the first logic value.

12. The method of claim 11, further comprising:
    connecting a pull-up resistor if the first logic value is a logical output of 1; and
    afterwards, disconnecting the pull-up and pull-down resistors.

13. The method of claim 11, further comprising:
    connecting a pull-up resistor to obtain a second logic value if the first logic value is a logical output of 0.

14. The method of claim 13, further comprising:
    sampling the digital signal at the I/O pin to determine whether the second logic value is a logical output of 1 or 0; and
    determining, based on the second logic value, that a second light level is lower than the first light level.

15. The method of claim 14, further comprising:
    determining, based on the second logic value, that a third light level is lower than the second light level.

16. The method of claim 14, further comprising:
    connecting the pull-down resistor if the second logic value is a logical output of 0; and
    afterwards, disconnecting the pull-up and pull-down resistors.

17. The method of claim 14, further comprising:
    connecting the pull-down resistor if the second logic value is a logical output of 1; and
    afterwards, disconnecting the pull-up and pull-down resistors.

18. An electronic device comprising:
    a light sensor configured to sense light and convert the sensed light to a first voltage;
    a microprocessor coupled to the light sensor, the microprocessor including a digital I/O pin and configured to receive the first voltage from the light sensor;
    a pull-up resistor coupled to the digital I/O pin; and
    a pull-down resistor coupled to the digital I/O pin;
        the microprocessor operative to selectively connect the pull-up resistor to the digital I/O pin at least partially in response to the first voltage; and
        the microprocessor operative to selectively connect the pull-down resistor to the digital I/O pin at least partially in response to the first voltage.

19. The electronic device of claim 18, further comprising a controller coupled to the I/O pin.

20. The electronic device of claim 19, further comprising a controlled component coupled to the controller.

* * * * *